United States Patent
Zhu et al.

(10) Patent No.: US 11,249,144 B2
(45) Date of Patent: Feb. 15, 2022

(54) ACTIVE AC POWER LOSS DETECTION

(71) Applicant: Cisco Technology, Inc., San Jose, CA (US)

(72) Inventors: Xiqun Zhu, Cupertino, CA (US); Sung Kee Baek, San Ramon, CA (US); Robert Gregory Twiss, Chapel Hill, NC (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/901,989

(22) Filed: Jun. 15, 2020

(65) Prior Publication Data

US 2020/0309861 A1 Oct. 1, 2020

Related U.S. Application Data

(63) Continuation of application No. 16/600,361, filed on Oct. 11, 2019, now Pat. No. 10,718,822, which is a (Continued)

(51) Int. Cl.
*G01R 31/58* (2020.01)
*G01R 19/165* (2006.01)
(Continued)

(52) U.S. Cl.
CPC ....... *G01R 31/58* (2020.01); *G01R 19/16547* (2013.01); *G01R 31/42* (2013.01);
(Continued)

(58) Field of Classification Search
CPC ......... G01R 31/023; G01R 31/42; H02J 3/00; H02J 13/00
See application file for complete search history.

(56) References Cited

U.S. PATENT DOCUMENTS 6,211,681 B1 * 4/2001 Kagawa ................ B60L 3/0046
324/426
10,473,729 B2 11/2019 Zhu
(Continued)

FOREIGN PATENT DOCUMENTS

EP 2232279 A1 9/2010
JP 2000055947 A 2/2000

OTHER PUBLICATIONS

"Alcatel-Lucent 1665, Data Multiplexer Extend (DMXtend), Release 10.0", Applications and Planning Guide, 365-372-324R10.0, Issue 2, Sep. 2013, 812 pages.

(Continued)

*Primary Examiner* — Michael J Dalbo
(74) *Attorney, Agent, or Firm* — Johnson, Marcou, Isaacs & Nix, LLC

(57) ABSTRACT

To reduce the rate at which a false alternating current ("AC") loss alarming signal is generated, but at the same time detect an actual AC loss situation in a timely manner, the disclosed method describes an AC line power loss detection and active verification method. If the AC line input voltage dips momentarily lower than a standard sine wave amplitude, the AC line may not be considered lost as long as it still has energy to drive a load. The method inserts a momentary load across the AC line and compares the AC line voltage before and after the extra load is applied. If the AC power is present, this extra loading will increase the AC loading current momentarily, but will not affect the AC line voltage. However, if the AC power is lost, such loading will lower the AC line voltage, indicating a loss of power.

20 Claims, 4 Drawing Sheets

Related U.S. Application Data continuation of application No. 15/261,860, filed on Sep. 9, 2016, now Pat. No. 10,473,729.

(51) Int. Cl.

| | | |
|---|---|---|
| *G01R 31/52* | (2020.01) | |
| *G01R 31/54* | (2020.01) | |
| *G01R 31/42* | (2006.01) | |
| *H02J 3/00* | (2006.01) | |
| *H02J 13/00* | (2006.01) | |

(52) U.S. Cl.
CPC ............ *G01R 31/52* (2020.01); *G01R 31/54* (2020.01); *H02J 3/00* (2013.01); *H02J 13/00* (2013.01)

(56) References Cited

U.S. PATENT DOCUMENTS

| | | |
|---|---|---|
| 2006/0012379 A1 | 1/2006 | Shimoe |
| 2008/0084213 A1 | 4/2008 | Waite |
| 2010/0289343 A1 | 11/2010 | Covaro |
| 2010/0301883 A1* | 12/2010 | Meyers .................. G01R 31/54 324/705 |
| 2018/0074136 A1* | 3/2018 | Zhu .......................... H02J 3/00 |
| 2018/0217187 A1* | 8/2018 | Urakawa .................. H02H 3/24 |
| 2020/0041579 A1* | 2/2020 | Zhu .......................... H02J 3/00 |

OTHER PUBLICATIONS

"Broadcom Limited, ACPL-C79B/C79A/C790, Precision Miniature Isolation Amplifiers", Jun. 29, 2012, 2 pages.

"TP48300B, V300R001C04, Engineer Manual, Huawei Technologies Co., Ltd.", Aug. 17, 2012, 44 pages.

Qu, et al., "Reduce Electrical Stresses in a PFC Stage during an AC Drop Test with UCD3138", SLUA768A—Dec. 2015—Revised Jan. 2018, 8 pages.

"Office Action in U.S. Appl. No. 16/600,361, filed Oct. 11, 2019", dated Mar. 3, 2020, 41 pages.

"Office Action issued in U.S. Appl. No. 15/261,860, filed Sep. 9, 2016", dated May 10, 2019, 25 pages.

Nguyen, "European Search Report for European Patent Application No. 17189087;", dated Jan. 23, 2018, 10 pages.

\* cited by examiner

ACTIVE AC POWER LOSS DETECTION

CROSS REFERENCE TO RELATED APPLICATIONS

This application is a continuation of and claims priority to U.S. patent application Ser. No. 16/600,361, filed on Oct. 11, 2019 and entitled "Active AC Power Loss Detection," which claims priority to U.S. patent application Ser. No. 15/261,860, filed on Sep. 9, 2016 and entitled "Active AC Power Loss Detection," now U.S. Pat. No. 10,473,729. The complete disclosure of each of the above-identified priority applications is hereby fully incorporated herein by reference.

TECHNICAL FIELD

The present disclosure relates generally to power distribution and, more particularly, to detecting and confirming power loss in a power distribution system.

BACKGROUND

With the rapid increase of complexity of computing, communication, and other systems, increasing amounts of power are needed to maintain operations in many systems. The increased system complexity often results in longer handling operations in the case of system power loss. For example, in a system power loss event, these systems require longer power hold-up time to properly save operation parameters of the components and/or to engage back up power supplies. The power hold-up time is the amount of time that the system can continue to run without resetting or rebooting during a power interruption.

Higher system power and longer hold-up time requirements put increasing pressures on power supply design. These designs typically require larger energy storage devices, which translates into higher costs and larger equipment sizes. To resolve this technical challenge, conventional systems have attempted to detect the input power loss at the earliest possible time to allow power loss reaction processes to begin as early as possible.

Alternating current ("AC") voltage changes instantaneous amplitude continuously from zero to its positive and negative maximum values in sinusoidal cycles. Conventional systems passively detect AC input voltage over a time window and, based on the voltage values, determine whether the AC power is still present or has been lost. When the voltage across the load drops below a certain level, an AC loss condition is detected. One disadvantage of this method is that the AC power loss may not be detected until one or more AC cycles later.

Other conventional methods read an instantaneous AC voltage and compare the read value against a sampled and delayed version of the data. Still other conventional methods read instantaneous AC voltage and compare the instantaneous values over a short period of time T, such as T=1 mS or T=0.5 mS, against standard AC waveform values to determine whether the AC input voltage remains within the range of a standard sine wave, or has dropped out of the range indicating a loss of AC power. This conventional solution creates a conflict between seeking a fast response to AC power loss when a shorter T is used, and avoiding a false positive response when the system mistakenly considers an AC line glitch as an AC power loss.

DESCRIPTION OF EXAMPLE EMBODIMENTS

Overview

Figure 1:
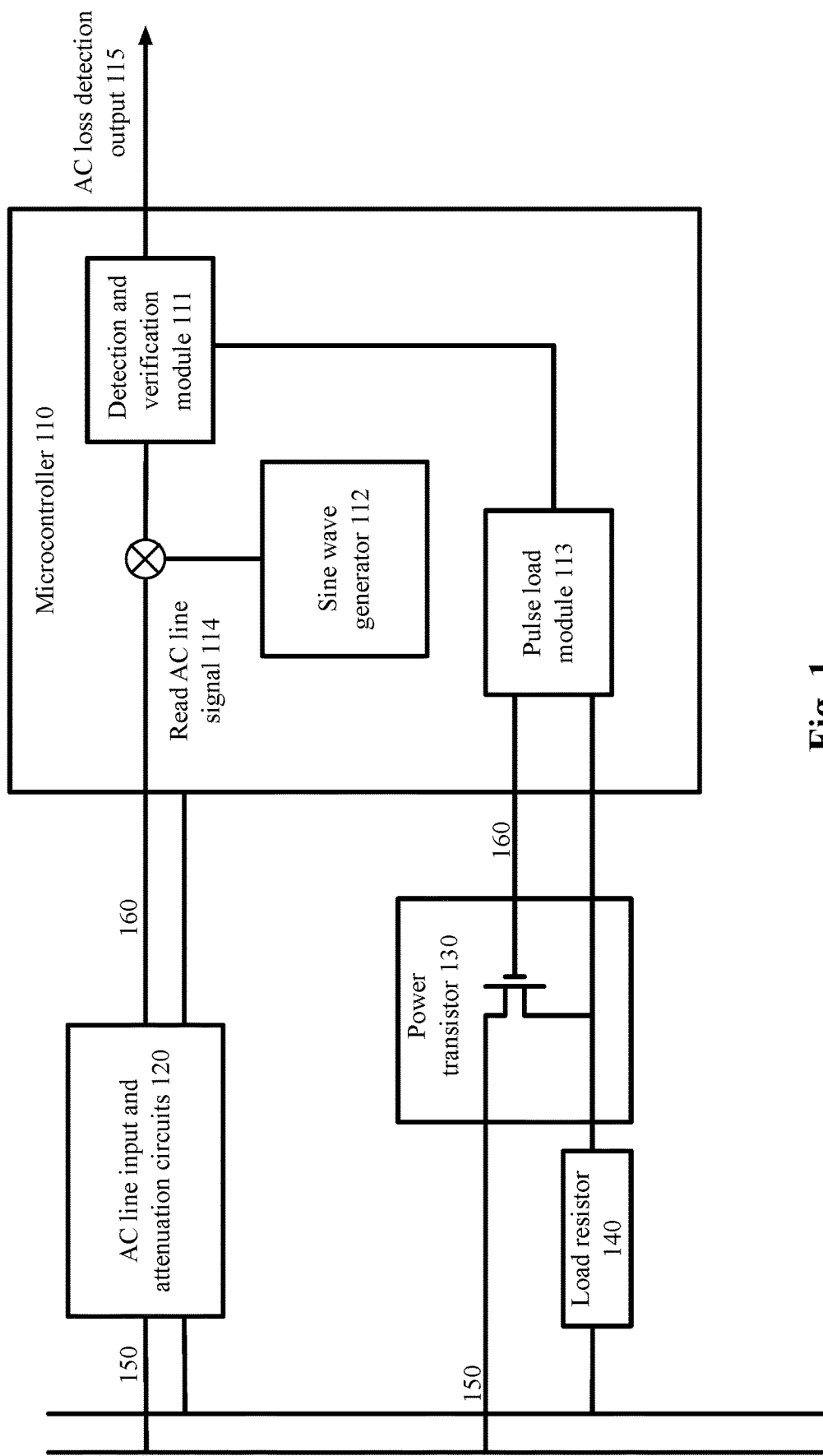
FIG. 1 is a block diagram depicting a system to determine and verify a loss of power in an electrical system, in accordance with certain example embodiments.

A power distribution system uses an active detection and confirmation method to detect an AC power loss condition. The active detection and confirmation allows AC power loss to be detected and confirmed earlier than conventional methods. The active confirmation process can reduce the rate of false alarms and provide reliable AC loss detection. For applications where input power redundancy is not possible due to cost or space restrictions, fast and reliable AC power loss detection can significantly improve system reliability. When AC power loss occurs, systems can be shut down in a controlled manner to ensure that the systems can be restored after AC power is recovered.

In example embodiments, the present technology includes circuits that provide a signal representing the instantaneous AC line voltage and suitable to supply the analog to digital converter in a microcontroller. The microcontroller generates a sine wave signal locally and synchronizes the sine wave to the AC line input. If the input AC power is normal, the difference between the two signals will be within a certain configured amount, such as 5V or 10V. If the comparison difference is larger than the configured amount, a possible AC loss situation may be indicated. The system then begins a confirmation process before reporting the possible power loss. In a certain example, the sine wave is a digital representation of an analog sine wave. In an example, the sine wave is a digital simulated sine wave.

Upon detection of a difference greater than the configured amount, the microcontroller applies a short positive pulse signal to a gate of a power semiconductor device that connects a load resistor across the AC line. The load resistor creates a momentary extra loading on the AC line. If the AC power is still present, the extra loading will momentarily increase the AC line load current, but will not affect the AC line voltage. However, if the AC line power is lost, the additional loading will drive the line voltage lower until it approaches zero. Based on the amount of change of the AC line voltage and current, the system determines if the power is lost in the AC line and takes appropriate action.

In an additional example, the AC line input frequency is mixed with another signal to create a heterodyne that allows for faster detection of an AC power interruption. For example, the AC line input at 60 Hz may be mixed with a 62 Hz signal to produce a 122 Hz signal. This signal is compared to a locally generated 122 Hz signal to identify a line interruption as described above.

By using and relying on the methods and systems described herein, a system reduces the rate of false AC loss alarming signals, but at the same time detects an actual AC loss situation in a timely manner. As such, the systems and methods described herein may allow a system to be constructed with less costly backup power systems or smaller energy storage devices. These systems and methods will reduce costs, unnecessary shutdowns, and power interruptions.

Description

Referring to the drawings, in which like numerals represent like (but not necessarily identical) elements throughout the figures, example embodiments are described.

FIG. 1 is diagram depicting a power system 100 with a microcontroller 110 and a load resistor 140, in accordance with certain example embodiments.

The system utilizes a microcontroller 110 to monitor the AC line power 160, generate a sine wave synchronized to the AC line, detect power anomalies, and confirm a power loss. The microcontroller 110 may be any microprocessor based device that performs the power monitoring tasks. The microcontroller 110 may utilize an AC loss detection and verification module 111, a sine wave generator 112, a pulse load to AC line module 113, and any other modules or elements to perform the described functions. The microcontroller 110 is configured to read an attenuated version of the incoming AC line power voltage 114, frequency, and current, and to monitor these characteristics for power loss or interruption. The microcontroller 110 is configured to provide an AC loss detection output 115 to any device, person, or system when the process determines that the AC power line has lost power. In certain embodiments, the functions of the microcontroller 110 described herein may be performed by the microcontroller 110, a module within the microcontroller 110, or any other suitable device, such as a voltage meter on the AC line or a control system for the facility power system.

The microcontroller 110 utilizes a sine wave generator 112. The sine wave generator 112 produces a locally generated sine wave that is synchronized to the incoming AC line frequency. For example, if the incoming AC line frequency is 60 Hz, the sine wave generator 112 produces a 60 Hz signal that is synchronized with the AC line frequency. To synchronize the frequencies, the sine wave generator 112 generates the sine wave such that the zero crossing of the generated sine wave occurs at the same moment as the zero crossing of the AC line sine wave or at a configured time afterward. Thus, the sine waves will reach peak amplitude, both positive and negative, at substantially the same time or at a configured time difference.

The microcontroller 110 includes an AC loss detection and verification module 111. The detection and verification module 111 monitors the attenuated AC line signal from the attenuation circuits 120, compares the AC voltage characteristics to the generated sine wave characteristics, identifies power interruptions, initiates the verification process, and performs other steps of the process as described in the method 200 of FIG. 2. Certain functions of the detection and verification module 111 may be described herein as being performed by the microcontroller 110 or other modules of the microcontroller 110. Conversely, certain functions of the microcontroller 110 may be described herein as being performed by the detection and verification module 111.

The microcontroller 110 utilizes a pulse load module 113 to activate the power transistor 130. The pulse load module 113 receives instructions from the detection and verification module 111 or another function of the microcontroller 110 and communicates a signal to the power transistor 130 to close the gate of the power transistor 130 and to thereby allow power to be supplied to the load resistor 140.

The power transistor 130 is used by the system 100 in the verification of an AC voltage loss in the system. The power transistor 130 is configured to receive a signal from the pulse load module 113 and to close a gate. The closed gate allows AC power from the system 100 to flow through the load resistor 140. By applying a short positive pulse signal, such as five microseconds, to the power transistor 130, the load resistor 140 is connected to the AC line momentarily as an extra loading. If the AC power is still present, this extra loading will increase the AC line load current, but not affect the AC line voltage, as measured by the microcontroller 110.

When the power transistor 130 is conducting, the load resistor 140 introduces a load to the power system. When the load resistor 140 is introduced into the system at a time that the system is receiving the required power, the extra loading will momentarily increase the AC line load current, but not affect the AC line voltage. However, if the AC line power is lost, the additional loading from the load resistor 140 will drive the line voltage lower, until it approaches zero. After the momentary power is pulsed to the load resistor 140, the power transistor 130 opens and the AC power does not flow to the load resistor 140.

The power supplied by the system is represented in the drawing as the power connections 150. This AC power may be supplied at any residential or commercial voltage, such as 120 V or 240 V. The power connections 160 represent the logic levels, such as 5 V. For example, the power supplied by the system to operate machinery, devices, or other elements of the system may be supplied at 120 V, but the control of the system as performed by the microcontroller 110 may operate at logic levels. The system may utilize the AC line input and attenuation circuits 120 to provide the logic level power 160 to the microcontroller 110. The AC line input and attenuation circuits 120 may include any devices to provide the power to the microcontroller 110.

In an example system, the smaller the value of the load resistor 140, the higher an amount of power will be used during the execution of the method 200. Similarly, the shorter the pulse width that is supplied to the power transistor 130, the lower the amount of power will be used during the execution of the method 200. Due to line parasitical inductance, if the pulse width is not longer than a minimum amount, voltage drop across the load resistor 140 may not be measured accurately.

In an example, to determine an acceptable load resistor value and pulse width, the types of applications in the power system, the power level of the power system, the physical size of the power system, and the circuit layout and packaging can be considered. These factors, and other suitable factors, affect the parasitical parameters of the circuit. Therefore, an example method to determine the load resistor value and pulse width can be based on an iterative approach. That is, selecting a small resistor value and large pulse width with which to start. The system may be tested with these selected values, and the extra loading current is monitored. The line voltage in the power system should not change if the resistor value is properly selected. If the line voltage does change, then the resistor value is too small and exceeds the line capability.

For example, for a power system operating at 120V/1 KW, the first iteration selects a resistor value and pulse width may select a 100 W resistor and a 1 mS pulse width and determines a voltage reading. After obtaining an acceptable measurement value, the method increases the resistor value (that is, decreases the resistor wattage) and decreases the pulse width, and obtains a new measurement. For example, in the second iteration, the method may select a 50 W resistor and a pulse width of 500 uS. If the voltage reading does not change, then the method may further reduce the resistor to 25 W and the pulse width to 250 uS. The method of increasing resistor values and decreasing pulse widths continues until the voltage reading becomes inaccurate. The inaccurate voltage readings indicate that circuit parasitical parameters are causing interferences. At this point, the method returns to an earlier iteration to obtain a preferred parameters setting. Based on the iterations, a preferred resistor value and pulse width are obtained. In this manner, the value of the load resistor 140 is sized such that the load is detectable by the microcontroller 110 while the pulse width of the power gate 130 is configured to be short enough to avoid excessive power consumption.

Figure 2:
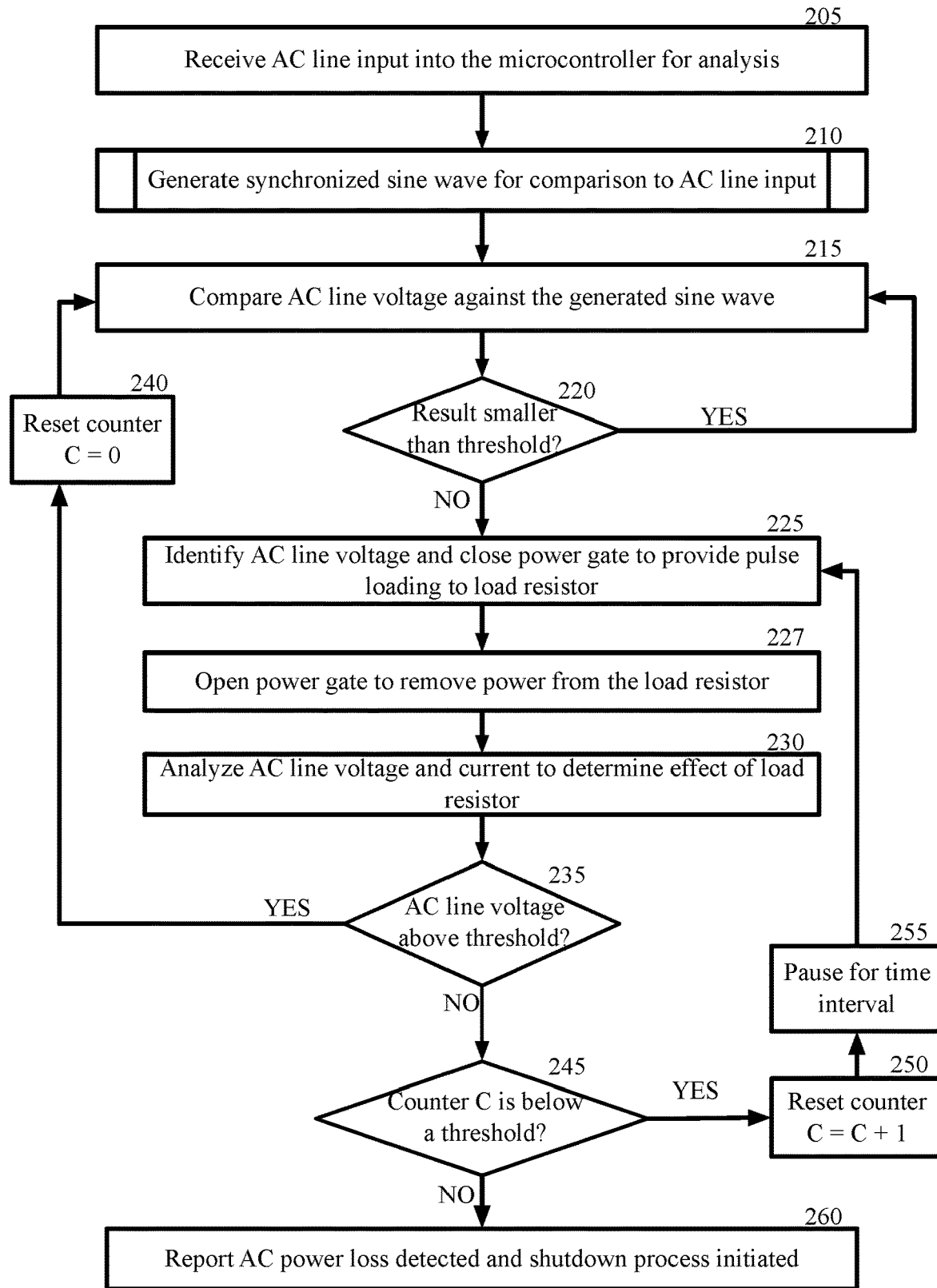
FIG. 2 is a block flow diagram depicting a method to determine and verify a loss of power in an electrical system, in accordance with certain example embodiments.

FIG. 2 is a block flow diagram depicting a method 200 to determine and verify if power has been lost in a system, in accordance with certain example embodiments. The method 200 is described with reference to the components illustrated in FIG. 1.

In block 205, the microcontroller 110 receives the AC line input for analysis. In certain examples, the microcontroller 110 is configured as part of a control system for the AC power distribution. The microcontroller 110 may be a separate device or system that is added to an existing system. The microcontroller 110 may be embodied a series of computer instructions that are performed by other devices. Any suitable microcontroller 110 configuration may be used. The AC power supplied to the microcontroller 110 may be at the house level voltage, such as 110 V, at a logic level voltage, such as 5 V, or at any suitable level. The AC power may be directly from the power system or the AC power may be conditioned in any other suitable manner.

In block 210, the microcontroller 110 generates a synchronized sine wave for comparison to the AC line power. The details of block 210 are described in greater detail in the method 210 of FIG. 3.

Figure 3:
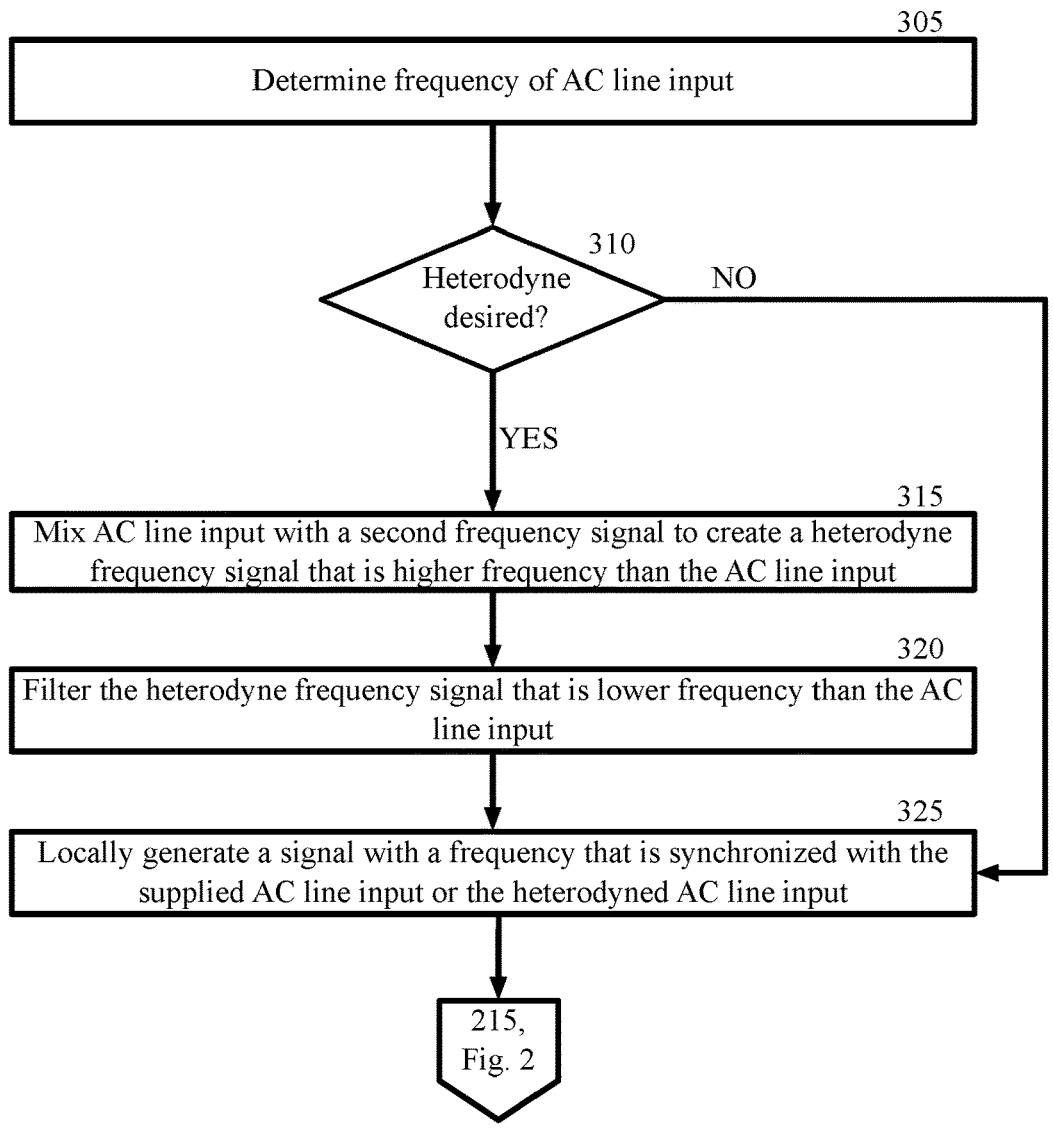
FIG. 3 is a block flow diagram depicting a method to generate a synchronized sine wave for comparison to AC line power, in accordance with certain example embodiments.

FIG. 3 is a block diagram depicting a method 210 to generate a synchronized sine wave for comparison to the waveform of AC line power, in accordance with certain example embodiments.

In block 305, the microcontroller 110 determines the frequency of the AC line input. The measurement may be made by any traditional frequency meter that is a function of the microcontroller 110 or logically connected to the microcontroller 110. For example, the microcontroller 110 determines that the AC line input is provided at a frequency of 60 Hz.

In block 310, the microcontroller 110 determines if the AC line power should be heterodyned to a higher frequency. For example, the detection and verification module 111 may make the determination. The detection of an AC power loss is dependent upon the amount of time that the sine wave of the power requires to cycle. For example, the power interruption may not be detectable until the sine wave of the power is above a certain number of volts, such as 5 V. If a power interruption happens at a zero crossing of the sine wave, the system will wait until the sine wave is again above 5 V before the power interruption is identifiable. Thus, the speed of detection of the power interruption is dependent on the frequency of the power.

By creating a faster heterodyne frequency, the detection time for a power interruption may be reduced. If a heterodyne frequency is desired by the microcontroller 110, then the method 210 proceeds to block 315 to create the heterodyne frequency.

In block 315, the microcontroller 110 mixes the AC line input with a second frequency signal to create a heterodyne frequency signal having a higher frequency than the AC line input. For example, if a 62 Hz signal is mixed with the 60 Hz AC line signal, two heterodynes are created, 122 Hz and 2 Hz. As the 122 Hz signal will cycle more than twice as fast as the 60 Hz signal, the detection time for a power interruption may be reduced accordingly.

In block 320, the microcontroller 110 filters the heterodyne frequency signal having a lower frequency than the AC line input. In the example, the 2 Hz signal is filtered out, leaving only the 122 Hz signal. The 2 Hz signal is not needed as the response time for a 2 Hz signal would be much slower than with the 60 Hz signal or the 122 Hz heterodyne signal.

From block 320, the method 210 proceeds to block 325. Returning to block 310, if the heterodyne is not desired by the microcontroller 110, then the method 210 proceeds directly to block 325.

In block 325, the microcontroller 110 locally generates a signal with a frequency that is synchronized with the supplied AC line input or the heterodyned AC line input. For example, the sine wave generator 112 may generate the signal. That is, if the heterodyne from the example is used by the microcontroller 110, then a 122 Hz signal is generated for comparison to the heterodyned AC line input. If the heterodyned signal is not used, but instead the original AC line input signal from the example is used, then a 60 Hz signal is generated for comparison to the AC line input. The signal is generated such that the sine wave of the two signals would match if overlaid upon one another. That is, the signals would cross the zero crossing at substantially the same time and rise to the peak amplitude at substantially the same time. In practice, a signal that is within 5 V or 10 V throughout the sine wave is desired. The difference between the signals may be compared to a configured threshold. The threshold may be the amount of difference between the signals before a positive result is indicated. This configurable difference between the two voltages may be dynamically adjusted to prevent false positive results. For example, if a 5 V threshold is used and false positive results occur at a rate that is unacceptable to the operators, a power system administrator, an end user, or any other suitable party, then the configured threshold may be incrementally increased, such as to 7 V, until the rate of false positives are below an acceptable level. In an alternate example, the synchronized wave is a configured amount of time behind the AC line input signal or before the AC line input signal. That is, the synchronized wave zero crossing may be a configured amount of time before or after the AC line input signal.

From block 325, the method 210 returns to block 215 of FIG. 2.

In block 215, the microcontroller 110 compares the AC line voltage 160 against the generated sine wave. For example, the microcontroller 110 obtains the AC line input 160 and the generated sine wave from the sine wave generator 112 for a comparison. For example, the comparison may be performed by the detection and verification module 111. The microcontroller compares the voltage level for each sine wave at a particular moment in time. If the voltages are substantially the same, such as within a 5 V configured threshold, then the sine waves are determined to match. In this example, the threshold is the configured difference between the two signals before a positive result is indicated. For example, if the configured threshold is 5 V, then if the sine wave voltage indicates 11 V and the AC line input 160 indicates 5 V, then the 6 V difference would exceed the configured threshold of 5 V. In another example, the microcontroller 110 determines the time that each sine wave performs a zero crossing. If the times are substantially the same, then the sine waves are determined to match. In the example, the comparison is performed in the detection and verification module 111. If the microcontroller 110 configures the sine wave to be incrementally ahead of or behind the AC line input 160, then the microcontroller 110 compares the two signals with a time delay on the leading signal. The time delay allows the two signals to be mathematically synchronized and compared at a similar time since the last zero crossing of each.

When the voltage levels do not match, a power interruption is indicated. A difference in the voltages may be caused by a power loss or a momentary interruption. A momentary amplitude interruption (typically referred to as a glitch) can be caused by various actions, such as a large load being started in the AC line. A determination that this glitch is an indication that power has been lost in the AC line would be a false positive indication. An actual power loss may be due to the power supply being powered down, a supply line being severed, or any other situation that may remove the power supply from the AC line.

In block 220, if the results of the comparison, such as a comparison of the voltage levels, are smaller than the configured threshold, then the method 200 returns to block 215 and the detection and verification module 111 continues to monitor the sine waves. For example, if the instantaneous voltage level of each sine wave are within 5 V of each other, then voltages are within the threshold and the method 200 returns to block 215.

If the results of the comparison are greater than the configured threshold, then the method 200 proceeds to block 225 to verify the potential power loss before a communication is transmitted that the power is lost in the power system. For example, if the instantaneous voltage levels of each sine wave are not within 5 V of each other, then the method 200 proceeds to block 225 to verify the power interruption.

In block 225, the pulse load module 113 identifies the AC line voltage and closes the gate of the power transistor 130 to provide pulse loading to the load resistor 140. Before the gate is closed, the microcontroller 110 obtains a measure of the AC line voltage for later comparison with the AC line voltage after the load is applied to the load resistor 140. The AC line voltage before the load is applied may be obtained from any suitable source, such as a meter in the microcontroller 110 or logically connected to the microcontroller 110. The AC line voltage may be recorded as the peak voltage measured during the AC cycle.

After the microcontroller 110 identifies the AC line voltage, the pulse load module 113 receives instructions from the detection and verification module 111 or another function of the microcontroller 110 and communicates a signal to the power transistor 130 to close and allow power to flow to the load resistor 140.

The power transistor 130 is configured to receive a signal from the pulse load module 113 and close the gate. The power transistor 130 is an on/off switch with the current from the source power system through the load resistor 140 and back to the AC power line controlled by the gate. The closed gate allows AC power from the AC line to flow through the load resistor 140. By applying a short positive pulse signal, such as five microseconds, to the power transistor 130, the load resistor 140 is connected to the AC line momentarily as an extra loading. If the AC power is still present, this extra loading will increase the AC line load current, but not affect the AC line voltage as seen by the microcontroller 110. The pulse width of the power transistor 130 can be configured to be short enough to avoid excessive power consumption as described previously.

In block 227, the pulse load module 113 communicates a signal to the power transistor 130 to open and stop power from flowing to the load resistor 140. The power transistor 130 opens the gate and power is cut off from the load resistor 140. In this example, the communication to the power transistor 130 in block 225 instructs the power transistor 130 to open the gate, and a separate communication in block 227 instructs the power transistor 130 to close the gate. In an alternate example, the communication to the power transistor 130 in block 225 instructs the power transistor 130 to pulse the gate open and closed. Any suitable method for providing a pulse of power to the load resistor 140 may be used.

In block 230, the microcontroller 110 analyzes the line voltage and current to determine the effect of the load resistor 140 on the system. The load resistor 140 introduces a load to the system when the power transistor 130 is conducting. When the load resistor 140 is introduced into the system and is receiving the required power, the extra loading will momentarily increase the AC line load current, but not affect the AC line voltage. However, if the AC line power is lost, the additional loading from the load resistor 140 will drive the line voltage lower, eventually approaching zero. After the momentary power is pulsed to the load resistor 140, the power transistor 130 opens, and the AC power is not provided to the load resistor 140. After the gate is closed, the microcontroller 110 obtains a measure of the AC line voltage for the comparison with the AC line voltage before the load is applied to the load resistor 140. The AC line voltage after the load is applied may be obtained from any suitable source, such as a meter in the microcontroller 110 or logically connected to the microcontroller 110. The AC line voltage may be recorded as the peak voltage measured during the AC cycle.

In block 235, the microcontroller 110 determines if the AC line voltage is within a configured threshold. The threshold may be the minimum voltage that the AC line voltage should be to determine if the AC power is lost or not. For example, if a voltage of the AC line input 160 is expected to be over a threshold of 100 volts, and the AC line input 160 is measured at 80 V, then the threshold is not met. The characteristics of the AC line may be determined by the microcontroller 110, a module within the microcontroller 110, or any other suitable device, such as a voltage meter on the AC line or a control system for the facility power system. The microcontroller 110 may also measure the current in the AC line input 160 to monitor the effects of the load resistor 140.

If the AC power is still present in the system, the extra loading from the load resistor 140 will momentarily increase the AC line load current, but not affect the AC line voltage. However, if the AC line power is lost, the additional loading will drive the line voltage lower until it approaches zero after successive applications of the load resistor. If the AC line power is lost, the microcontroller 110 may detect a drop in the line voltage that is over a threshold, such as a 10 V drop, when the load is applied to the line. For example, if the AC line voltage drop is measured at 20 V, and thus over a 10 V drop threshold, then the microcontroller 110 would identify the voltage drop as likely being due to an AC power loss. That is, instead of, or in addition to, configuring the threshold as a minimum voltage, the microprocessor 110 may receive a configured drop threshold that provides an amount that the voltage may drop after application of the load resistor 140 to the AC power. For example, if the drop is greater than the threshold, then an AC power interruption is indicated.

In another example, the AC line voltage from before the introduction of the load resistor 140 is compared to the AC line voltage from after the introduction of the load resistor 140. That is, if the AC line voltage obtained at block 225 before the gate is closed is 110 V and the AC line voltage obtained at block 230 after the gate is closed is at 90 V, then the addition of the load resistor 140 will be determined to have caused a 20 V drop in the AC line voltage. In another example, the AC line voltage from after the introduction of the load resistor 140 is compared to a threshold. The threshold may be the minimum amount of peak voltage for the AC line. For example, if the AC line voltage is normally 110 V, then the threshold may be configured to be 90 V. Any reading below 90 V in the example would be determined to be below the threshold.

In another example, the microcontroller 110 may detect that the AC voltage is dropping at a certain rate greater than a configured rate while the load is applied. The rate that the voltage is dropping may be identified as an indication that the AC power is lost. In another example, the microcontroller 110 may detect that the measured AC current is below a configured AC current threshold while the load is applied. Any other appropriate characteristic of the AC line power may be analyzed to determine if the AC power is lost when the load is applied.

Based on the results of the analysis of the momentary load on the system, the method 200 proceeds to block 240 if the AC line voltage is above the threshold or otherwise within an expected range.

In block 240, a counter is set to zero. The counter is used by the microcontroller 110 to perform multiple verifications before a determination is made that the power is lost in the AC line. In an example, because of the serious effect of initiating a shutdown based on a false positive result, the microcontroller 110 requires a configured number of positive results before determining that the AC line power is lost. The counter is utilized to count the number of positive results that have been recorded.

The number of positive results is represented by the letter "C". For example, if one positive result has been recorded, then C=1. If three positive results have been recorded, then C=3. In block 240, the counter is reset to zero because the latest result indicated that the AC power was not lost.

From block 240, the method 200 returns to block 215 to compare voltages to identify another potential power interruption in the AC line.

Returning to block 235, based on the results of the analysis of the momentary load on the system, the method 200 proceeds to block 245 if the AC line voltage or current is below the threshold or otherwise outside of an acceptable range, as described previously.

In block 245, the microcontroller 110 determines if the counter C is equal to a threshold. The threshold may represent a minimum number of positive indications of AC power loss. The desired minimum number can be configured as a threshold number for comparison to the current count of counter C. The threshold may be configured by any suitable party or device. For example, the threshold may be set by a system operator, by an algorithm in the microcontroller 110, or by any other suitable party. The threshold may be configured based on a level of confidence that is desired for the AC system. For example, a higher threshold may lead to a higher number of positive indications of AC power loss before the microcontroller 110 determines that a power loss condition exists. However, a higher threshold takes a greater amount of time to make the determination. A lower threshold takes a lower number of positive indications of AC power loss before the microcontroller 110 determines that a power loss condition exists. However, a lower threshold may result in more false positive determinations, which may prompt unnecessary system shutdowns or other undesirable actions. The thresholds may be configured to achieve a balance between the desires for less false positives and faster responses.

If the counter C is below the threshold, then the method 200 proceeds to block 250. In block 250, the counter C is increased by one unit, as shown by C=C+1. For example, if C is 1, then in block 250, C would increase to 2.

In block 255, the microcontroller 110 pauses for a configured interval of time. The interval may be adjusted dynamically to reflect the particular system design goals. Shorter time intervals produce faster AC power loss detection, while longer intervals will produce a more reliable AC power loss determination and minimize false positive results. For example, a shorter time interval allows less time for a momentary glitch to be resolved. Thus, a shorter time interval may provide a less reliable detection of a power loss. A longer time interval allows a more reliable AC power loss determination because system glitches or other temporary interruptions may be resolved before the system declares a power interruption. The interval may be configured by any suitable party or device. For example, the interval may be set by a system operator, by an algorithm in the microcontroller 110, or by any other suitable party.

From block 255, the method 200 returns to block 225 where another pulse is applied to the power transistor 130.

Returning to block 245, if the counter C equals the threshold, then the method 200 proceeds to block 260. In block 260, the microcontroller 110 reports that the AC power loss is identified and a shutdown process is initiated. The microcontroller 110 may report the AC power loss to any suitable party or device. For example, the microcontroller 110 may provide an alarm or other notice to a power system operator. The microcontroller 110 may provide a signal to a power system operating system that initiates a shutdown procedure. For example, the system may begin a shutdown procedure based on the signal that allows critical system to be shutdown in a manner that preserves stored data, closes critical applications, disengages potentially dangerous machinery, or performs any other functions to ensure a safe and recoverable shutdown of the system. The microcontroller 110 may initiate a power backup routine. The microcontroller 110 may perform any appropriate procedures based on the determination of the AC power loss.

The disclosed systems and methods recites AC line power loss detection and active verification. Even if the AC line input voltage dips momentarily lower than a standard sine wave amplitude, the AC line power may not be considered lost as long as it still has energy to drive a load. The momentary amplitude interruption (typically referred to as a "glitch") can be caused by various actions, such as a large load being started in the AC line. A determination that this glitch is an indication that power has been lost in the AC line would be a false positive indication. If this glitch happens near the AC wave zero crossing, a voltage measurement will indicate a relatively long time period that AC line amplitude is lower than a certain amount, such as 5V or 10V. This glitch can be recognized as an AC line loss by a conventional system, and an unnecessary system shutdown may be triggered.

The technologies described herein can reduce the rate at which a false AC loss alarming signal is generated, but at the same time detect an actual AC loss situation in a timely manner. These technologies insert a momentary load across the AC line and compares the AC line voltage before and after the extra load is applied. If the AC power is present, this extra loading will increase the AC loading current momentarily, but will not affect the AC line voltage. However, if the AC power is lost, such loading will bring the AC line voltage lower, eventually approaching zero.

Other Example Embodiments

Figure 4:
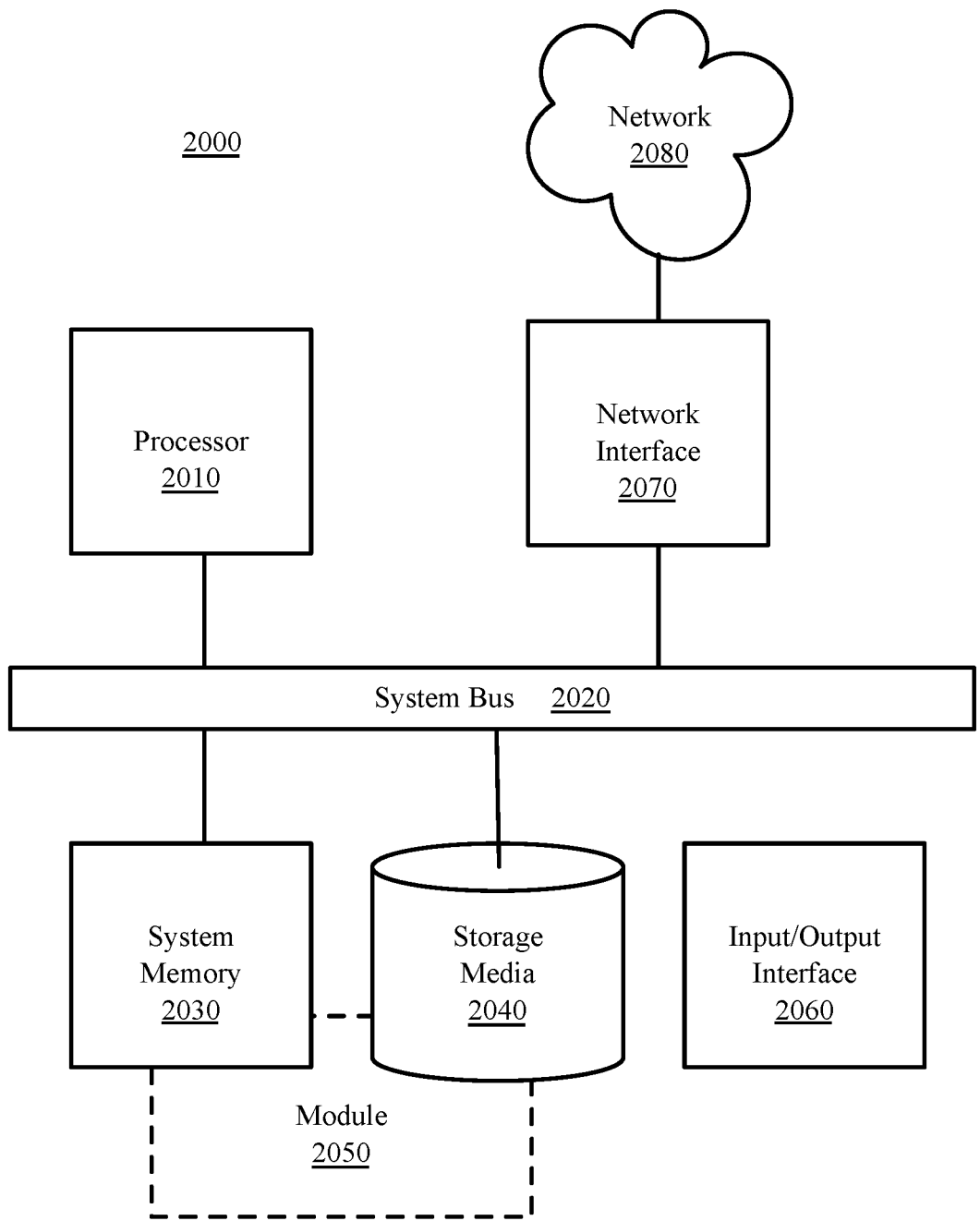
FIG. 4 is a block diagram depicting a computing machine and module, in accordance with certain example embodiments.

FIG. 4 depicts a computing machine 2000 and a module 2050 in accordance with certain example embodiments. The computing machine 2000 may correspond to any of the various computers, servers, mobile devices, embedded systems, or computing systems presented herein. The module 2050 may comprise one or more hardware or software elements configured to facilitate the computing machine 2000 in performing the various methods and processing functions presented herein. The computing machine 2000 may include various internal or attached components such as a processor 2010, system bus 2020, system memory 2030, storage media 2040, input/output interface 2060, and a network interface 2070 for communicating with a network 2080.

The computing machine 2000 may be implemented as a conventional computer system, an embedded controller, a laptop, a server, a mobile device, a smartphone, a set-top box, a kiosk, a vehicular information system, a television with one or more processors embedded therein and/or coupled thereto, a customized machine, any other hardware platform, or any combination or multiplicity thereof. The computing machine 2000 may be a distributed system configured to function using multiple computing machines interconnected via a data network or bus system.

The processor 2010 may be configured to execute code or instructions to perform the operations and functionality described herein, manage request flow and address mappings, and to perform calculations and generate commands. The processor 2010 may be configured to monitor and control the operation of the components in the computing machine 2000. The processor 2010 may be a general purpose processor, a processor core, a multiprocessor, a reconfigurable processor, a microcontroller, a digital signal processor ("DSP"), an application specific integrated circuit ("ASIC"), a graphics processing unit ("GPU"), a field programmable gate array ("FPGA"), a programmable logic device ("PLD"), a controller, a state machine, gated logic, discrete hardware components, any other processing unit, or any combination or multiplicity thereof. The processor 2010 may be a single processing unit, multiple processing units, a single processing core, multiple processing cores, special purpose processing cores, co-processors, or any combination thereof. According to certain embodiments, the processor 2010 along with other components of the computing machine 2000 may be a virtualized computing machine executing within one or more other computing machines.

The system memory 2030 may include non-volatile memories such as read-only memory ("ROM"), programmable read-only memory ("PROM"), erasable programmable read-only memory ("EPROM"), flash memory, or any other device capable of storing program instructions or data with or without applied power. The system memory 2030 may also include volatile memories such as random access memory ("RAM"), static random access memory ("SRAM"), dynamic random access memory ("DRAM"), and synchronous dynamic random access memory ("SDRAM"). Other types of RAM also may be used to implement the system memory 2030. The system memory 2030 may be implemented using a single memory module or multiple memory modules. While the system memory 2030 is depicted as being part of the computing machine 2000, one skilled in the art will recognize that the system memory 2030 may be separate from the computing machine 2000 without departing from the scope of the subject technology. It should also be appreciated that the system memory 2030 may include, or operate in conjunction with, a non-volatile storage device such as the storage media 2040.

The storage media 2040 may include a hard disk, a floppy disk, a compact disc read only memory ("CD-ROM"), a digital versatile disc ("DVD"), a Blu-ray disc, a magnetic tape, a flash memory, other non-volatile memory device, a solid state drive ("SSD"), any magnetic storage device, any optical storage device, any electrical storage device, any semiconductor storage device, any physical-based storage device, any other data storage device, or any combination or multiplicity thereof. The storage media 2040 may store one or more operating systems, application programs and program modules such as module 2050, data, or any other information. The storage media 2040 may be part of, or connected to, the computing machine 2000. The storage media 2040 may also be part of one or more other computing machines that are in communication with the computing machine 2000 such as servers, database servers, cloud storage, network attached storage, and so forth.

The module 2050 may comprise one or more hardware or software elements configured to facilitate the computing machine 2000 with performing the various methods and processing functions presented herein. The module 2050 may include one or more sequences of instructions stored as software or firmware in association with the system memory 2030, the storage media 2040, or both. The storage media 2040 may therefore represent examples of machine or computer readable media on which instructions or code may be stored for execution by the processor 2010. Machine or computer readable media may generally refer to any medium or media used to provide instructions to the processor 2010. Such machine or computer readable media associated with the module 2050 may comprise a computer software product. It should be appreciated that a computer software product comprising the module 2050 may also be associated with one or more processes or methods for delivering the module 2050 to the computing machine 2000 via the network 2080, any signal-bearing medium, or any other communication or delivery technology. The module 2050 may also comprise hardware circuits or information for configuring hardware circuits such as microcode or configuration information for an FPGA or other PLD.

The input/output ("I/O") interface 2060 may be configured to couple to one or more external devices, to receive data from the one or more external devices, and to send data to the one or more external devices. Such external devices along with the various internal devices may also be known as peripheral devices. The I/O interface 2060 may include both electrical and physical connections for operably coupling the various peripheral devices to the computing machine 2000 or the processor 2010. The I/O interface 2060 may be configured to communicate data, addresses, and control signals between the peripheral devices, the computing machine 2000, or the processor 2010. The I/O interface 2060 may be configured to implement any standard interface, such as small computer system interface ("SCSI"), serial-attached SCSI ("SAS"), fiber channel, peripheral component interconnect ("PCI"), PCI express (PCIe), serial bus, parallel bus, advanced technology attached ("ATA"), serial ATA ("SATA"), universal serial bus ("USB"), Thunderbolt, FireWire, various video buses, and the like. The I/O interface 2060 may be configured to implement only one interface or bus technology. Alternatively, the I/O interface 2060 may be configured to implement multiple interfaces or bus technologies. The I/O interface 2060 may be configured as part of, all of, or to operate in conjunction with, the system bus 2020. The I/O interface 2060 may include one or more buffers for buffering transmissions between one or more external devices, internal devices, the computing machine 2000, or the processor 2010.

The I/O interface 2060 may couple the computing machine 2000 to various input devices including mice, touch-screens, scanners, electronic digitizers, sensors, receivers, touchpads, trackballs, cameras, microphones, keyboards, any other pointing devices, or any combinations thereof. The I/O interface 2060 may couple the computing machine 2000 to various output devices including video displays, speakers, printers, projectors, tactile feedback devices, automation control, robotic components, actuators, motors, fans, solenoids, valves, pumps, transmitters, signal emitters, lights, and so forth.

The computing machine 2000 may operate in a networked environment using logical connections through the network interface 2070 to one or more other systems or computing machines across the network 2080. The network 2080 may include wide area networks (WAN), local area networks (LAN), intranets, the Internet, wireless access networks, wired networks, mobile networks, telephone networks, optical networks, or combinations thereof. The network 2080 may be packet switched, circuit switched, of any topology, and may use any communication protocol. Communication links within the network 2080 may involve various digital or an analog communication media such as fiber optic cables, free-space optics, waveguides, electrical conductors, wireless links, antennas, radio-frequency communications, and so forth.

The processor 2010 may be connected to the other elements of the computing machine 2000 or the various peripherals discussed herein through the system bus 2020. It should be appreciated that the system bus 2020 may be within the processor 2010, outside the processor 2010, or both. According to some embodiments, any of the processor 2010, the other elements of the computing machine 2000, or the various peripherals discussed herein may be integrated into a single device such as a system on chip ("SOC"), system on package ("SOP"), or ASIC device.

In situations in which the systems discussed here collect personal information about users, or may make use of personal information, the users may be provided with an opportunity or option to control whether programs or features collect user information (e.g., information about a user's social network, social actions or activities, profession, a user's preferences, or a user's current location), or to control whether and/or how to receive content from the content server that may be more relevant to the user. In addition, certain data may be treated in one or more ways before it is stored or used, so that personally identifiable information is removed. For example, a user's identity may be treated so that no personally identifiable information can be determined for the user, or a user's geographic location may be generalized where location information is obtained (such as to a city, ZIP code, or state level), so that a particular location of a user cannot be determined. Thus, the user may have control over how information is collected about the user and used by a content server.

Embodiments may comprise a computer program that embodies the functions described and illustrated herein, wherein the computer program is implemented in a computer system that comprises instructions stored in a machine-readable medium and a processor that executes the instructions. However, it should be apparent that there could be many different ways of implementing embodiments in computer programming, and the embodiments should not be construed as limited to any one set of computer program instructions. Further, a skilled programmer would be able to write such a computer program to implement an embodiment of the disclosed embodiments based on the appended flow charts and associated description in the application text. Therefore, disclosure of a particular set of program code instructions is not considered necessary for an adequate understanding of how to make and use embodiments. Further, those skilled in the art will appreciate that one or more aspects of embodiments described herein may be performed by hardware, software, or a combination thereof, as may be embodied in one or more computing systems. Moreover, any reference to an act being performed by a computer should not be construed as being performed by a single computer as more than one computer may perform the act.

The example embodiments described herein can be used with computer hardware and software that perform the methods and processing functions described herein. The systems, methods, and procedures described herein can be embodied in a programmable computer, computer-executable software, or digital circuitry. The software can be stored on computer-readable media. For example, computer-readable media can include a floppy disk, RAM, ROM, hard disk, removable media, flash memory, memory stick, optical media, magneto-optical media, CD-ROM, etc. Digital circuitry can include integrated circuits, gate arrays, building block logic, field programmable gate arrays (FPGA), etc.

The example systems, methods, and acts described in the embodiments presented previously are illustrative, and, in alternative embodiments, certain acts can be performed in a different order, in parallel with one another, omitted entirely, and/or combined between different example embodiments, and/or certain additional acts can be performed, without departing from the scope and spirit of various embodiments. Accordingly, such alternative embodiments are included in the invention claimed herein.

Although specific embodiments have been described above in detail, the description is merely for purposes of illustration. It should be appreciated, therefore, that many aspects described above are not intended as required or essential elements unless explicitly stated otherwise. Modifications of, and equivalent components or acts corresponding to, the disclosed aspects of the example embodiments, in addition to those described above, can be made by a person of ordinary skill in the art, having the benefit of the present disclosure, without departing from the spirit and scope of embodiments defined in the following claims, the scope of which is to be accorded the broadest interpretation so as to encompass such modifications and equivalent structures.

In example embodiments, the network computing devices and any other computing machines associated with the technology presented herein may be any type of computing machine such as, but not limited to, those discussed in more detail with respect to FIG. 4. Furthermore, any modules associated with any of these computing machines, such as modules described herein or any other modules (scripts, web content, software, firmware, or hardware) associated with the technology presented herein may by any of the modules discussed in more detail with respect to FIGS. 1-3. The computing machines discussed herein may communicate with one another as well as other computer machines or communication systems over one or more networks. A network may include any type of data or communications network, including any of the network technology discussed with respect to FIG. 4.

What is claimed is:

1. A method, comprising:
by one or more computing devices:
receiving an input of an alternating current ("AC") power from an AC power line;
generating a sine wave that is initially synchronized with a frequency of the AC power input;
upon determining that an instantaneous voltage level of the AC power input is zero at a time that is different from a time that a voltage level of the generated sine wave is zero, applying a momentary load to the AC power line;
determining that a difference between an AC power line characteristic before application of the momentary load and the AC power line characteristic after application of the momentary load is greater than a configured value, wherein the AC power line characteristic is a voltage, a frequency, or a current of the AC power line; and
at least in part in response to determining that the difference after application of the momentary load is greater than the configured value, determining that the AC power line has lost power.

2. The method of claim 1, further comprising generating a heterodyne signal.

3. The method of claim 2, wherein the heterodyne signal is generated by:
mixing an initial input AC power with a signal to create two heterodyne signals comprising a lower frequency heterodyne signal and a higher frequency heterodyne signal; and
filtering the lower frequency heterodyne signal and retaining the higher frequency heterodyne signal.

4. The method of claim 3, wherein the generated sine wave is initially synchronized to the higher frequency heterodyne signal.

5. The method of claim 1, further comprising:
upon determining that the difference after application of the momentary load is greater than the configured value, applying a momentary load to the AC power line a second time; and
determining that a difference between an AC power line characteristic before the second application of the momentary load and the AC power line characteristic after the second application of the momentary load is also greater than the configured value,
wherein the AC power line characteristic is a voltage, a frequency, or a current of the AC power line, and the determining that the AC power line has lost power is in response to both determining that the difference after the second application of the momentary load is greater than the configured value and determining that the difference after application of the momentary load is greater than the configured value.

6. The method of claim 5, further comprising repeating the steps of applying a momentary load and determining a difference until a configured number of determinations that the difference of the AC power line after application of the momentary load is greater than the configured value has been reached.

7. The method of claim 5, further comprising communicating a notification that the AC power line has lost power in response to determining that the AC power line has lost power.

8. The method of claim 5, further comprising initiating a shutdown procedure in response to determining that the AC power line has lost power.

9. The method of claim 1, wherein the one or more computing devices is a microcontroller.

10. The method of claim 1, wherein applying a momentary load to the AC power line comprises pulsing a power transistor to conduct current from the AC power line through a load resistor.

11. A tangible, non-transitory, computer-readable media having software encoded thereon, the software when executed by a processor operable to:
generate a sine wave that is initially synchronized with a received conditioned alternating current ("AC") power input from an AC power line and of an equivalent frequency to the AC power input;
upon a determination that an instantaneous voltage level of the AC power input is zero at a time that is different from a time that a voltage level of the generated sine wave is zero, pulse a power transistor to conduct current from the AC power line through a load resistor;
determine that a difference between an AC power line characteristic before pulsing the power transistor and the AC power line characteristic after pulsing the power transistor is greater than a configured value, wherein the AC power line characteristic is a voltage, a frequency, or a current of the AC power line; and
in response to determining that the difference after pulsing the power transistor is greater than the configured value, determine that the AC power line has lost power.

12. The computer-readable media of claim 11, the software when executed by the processor being further operable to generate a heterodyne signal.

13. The computer-readable media of claim 12, the software when executed by the processor being further operable to:
mix the AC power input with a signal to create two heterodyne signals comprising a lower frequency heterodyne signal and a higher frequency heterodyne signal; and
filter the lower frequency heterodyne signal and retain the higher frequency heterodyne signal.

14. The computer-readable media of claim 11, the software when executed by the processor being further operable to:
upon the determination that the difference is greater than the configured value, pulse the power transistor to conduct current from the AC power line through the load resistor a second time;
determine that a difference between an AC power line characteristic before pulsing the power transistor the second time and the AC power line characteristic after pulsing the power transistor the second time is greater than the configured value; and
wherein the AC power line characteristic is a voltage, a frequency, or a current of the AC power line, and the determining that the AC power line has lost power is in response to both determining that the difference after pulsing the power transistor the second time is greater than the configured value and that the time difference of the AC power line after pulsing the power transistor is greater than the configured value.

15. The computer-readable media of claim 14, the software when executed by the processor being further operable to repeat the steps of pulsing the power transistor and determining a difference until a configured number of determinations that the difference is greater than the configured value has been reached.

16. The computer-readable media of claim 14, the software when executed by the processor being further operable to communicate a notification that the AC power line has lost power in response to determining that the AC power line has lost power.

17. A system, comprising:
a processor adapted to execute one or more processes; and
a memory configured to store a process executable by the processor, the process when executed operable to:
generate a sine wave that is initially synchronized with a received alternating current ("AC") power input from an AC power line and of an equivalent frequency to the AC power input;
upon a determination that an instantaneous voltage level of the AC power input is zero at a time that is different from a time that a voltage level of the generated sine wave is zero, pulse a power transistor to conduct current from the AC power line through a load resistor;
determine after each of a plurality of pulses that a difference between an AC power line characteristic before pulsing the power transistor and the AC power line characteristic after pulsing the power transistor is greater than a configured value, wherein the AC power line characteristic is a voltage, a frequency, or a current of the AC power line; and
in response to determining in at least two successive determinations that the difference is greater than the configured value, determine that the AC power line has lost power.

18. The system of claim 17, the process when executed being further operable to communicate a notification that the AC power line has lost power in response to determining that the AC power line has lost power.

19. The system of claim 17, the process when executed being further operable to initiate a shutdown procedure in response to determining that the AC power line has lost power.

20. The system of claim 17, the process when executed being further operable to:
mix the AC power input with a signal to create two heterodyne signals comprising a lower frequency heterodyne signal and a higher frequency heterodyne signal; and
filter the lower frequency heterodyne signal and retain the higher frequency heterodyne signal,
wherein the generated sine wave is initially synchronized to the higher frequency heterodyne AC signal.

* * * * *

UNITED STATES PATENT AND TRADEMARK OFFICE
CERTIFICATE OF CORRECTION

| | |
|---|---|
| PATENT NO. | : 11,249,144 B2 |
| APPLICATION NO. | : 16/901989 |
| DATED | : February 15, 2022 |
| INVENTOR(S) | : Xiqun Zhu et al. |

It is certified that error appears in the above-identified patent and that said Letters Patent is hereby corrected as shown below:

In the Claims

Column 16, Line 67, change "time difference" to -- difference --.

Signed and Sealed this
Twenty-eighth Day of June, 2022

*Katherine Kelly Vidal*

Katherine Kelly Vidal
*Director of the United States Patent and Trademark Office*